United States Patent
Peng et al.

(10) Patent No.: US 9,630,295 B2
(45) Date of Patent: Apr. 25, 2017

(54) MECHANISMS FOR REMOVING DEBRIS FROM POLISHING PAD

(71) Applicant: TAIWAN SEMICONDUCTOR MANUFACTURING CO., LTD., Hsin-Chu (TW)

(72) Inventors: He-Hui Peng, Changhua (TW); Fu-Ming Huang, Shengang Township (TW); Shich-Chang Suen, Hsinchu (TW); Han-Hsin Kuo, Tainan (TW); Chi-Ming Tsai, New Taipei (TW); Liang-Guang Chen, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 806 days.

(21) Appl. No.: 13/944,353

(22) Filed: Jul. 17, 2013

(65) Prior Publication Data

US 2015/0024661 A1    Jan. 22, 2015

(51) Int. Cl.
*B24B 53/017* (2012.01)
*H01L 21/304* (2006.01)
*B08B 3/02* (2006.01)

(52) U.S. Cl.
CPC .............. *B24B 53/017* (2013.01); *B08B 3/02* (2013.01); *H01L 21/304* (2013.01)

(58) Field of Classification Search
None
See application file for complete search history.

(56) References Cited

U.S. PATENT DOCUMENTS

| | | | | |
|---|---|---|---|---|
| 4,099,399 A | * | 7/1978 | Berry | B21B 45/04 72/38 |
| 5,702,563 A | * | 12/1997 | Salugsugan | H01L 21/3212 216/89 |
| 5,893,753 A | * | 4/1999 | Hempel, Jr. | B08B 1/007 134/198 |
| 6,241,587 B1 | * | 6/2001 | Drill | B24B 1/04 451/444 |
| 6,319,098 B1 | * | 11/2001 | Osterheld | B24B 37/04 451/444 |
| 2003/0216112 A1 | * | 11/2003 | Gotze | B08B 1/04 451/56 |
| 2004/0206452 A1 | * | 10/2004 | Okuda | B08B 1/04 156/345.11 |
| 2010/0285723 A1 | * | 11/2010 | Lin | B24B 37/107 451/5 |

\* cited by examiner

*Primary Examiner* — Nicole Blan
(74) *Attorney, Agent, or Firm* — Birch, Stewart, Kolasch & Birch, LLP

(57) ABSTRACT

Embodiments of mechanisms for performing a chemical mechanical polishing (CMP) process are provided. A method for performing a CMP process includes polishing a wafer by using a polishing pad. The method also includes applying a cleaning liquid jet on the polishing pad to condition the polishing pad. A CMP system is also provided.

20 Claims, 8 Drawing Sheets

MECHANISMS FOR REMOVING DEBRIS FROM POLISHING PAD

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

In recent decades, the chemical mechanical polishing (CMP) process has been used to planarize layers used to build up ICs, thereby helping to provide more precisely structured device features on the ICs. The CMP process is a planarization process that combines chemical removal with mechanical polishing. The CMP process is a favored process because it achieves global planarization across the entire wafer surface. The CMP polishes and removes materials from the wafer, and works on multi-material surfaces. Furthermore, the CMP process avoids the use of hazardous gasses, and/or is usually a low-cost process.

Since the CMP process is one of the important processes for forming ICs, it is desired to have mechanisms to maintain the reliability and the efficiency of the CMP process.

BRIEF DESCRIPTION OF THE DRAWINGS

For a more complete understanding of the embodiments, and the advantages thereof, reference is now made to the following descriptions taken in conjunction with the accompany drawings, in which.

DETAILED DESCRIPTION OF THE ILLUSTRATIVE EMBODIMENTS

The making and using of the embodiments of the disclosure are discussed in detail below. It should be appreciated, however, that the embodiments can be embodied in a wide variety of specific contexts. The specific embodiments discussed are merely illustrative, and do not limit the scope of the disclosure.

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows include embodiments in which the first and second features are formed in direct contact, and may also include embodiments in which additional features may be formed between the first and second features, such that the first and second features may not be in direct contact.

Some variations of the embodiments are described. Throughout the various views and illustrative embodiments, like reference numbers are used to designate like elements.

Figure 1:
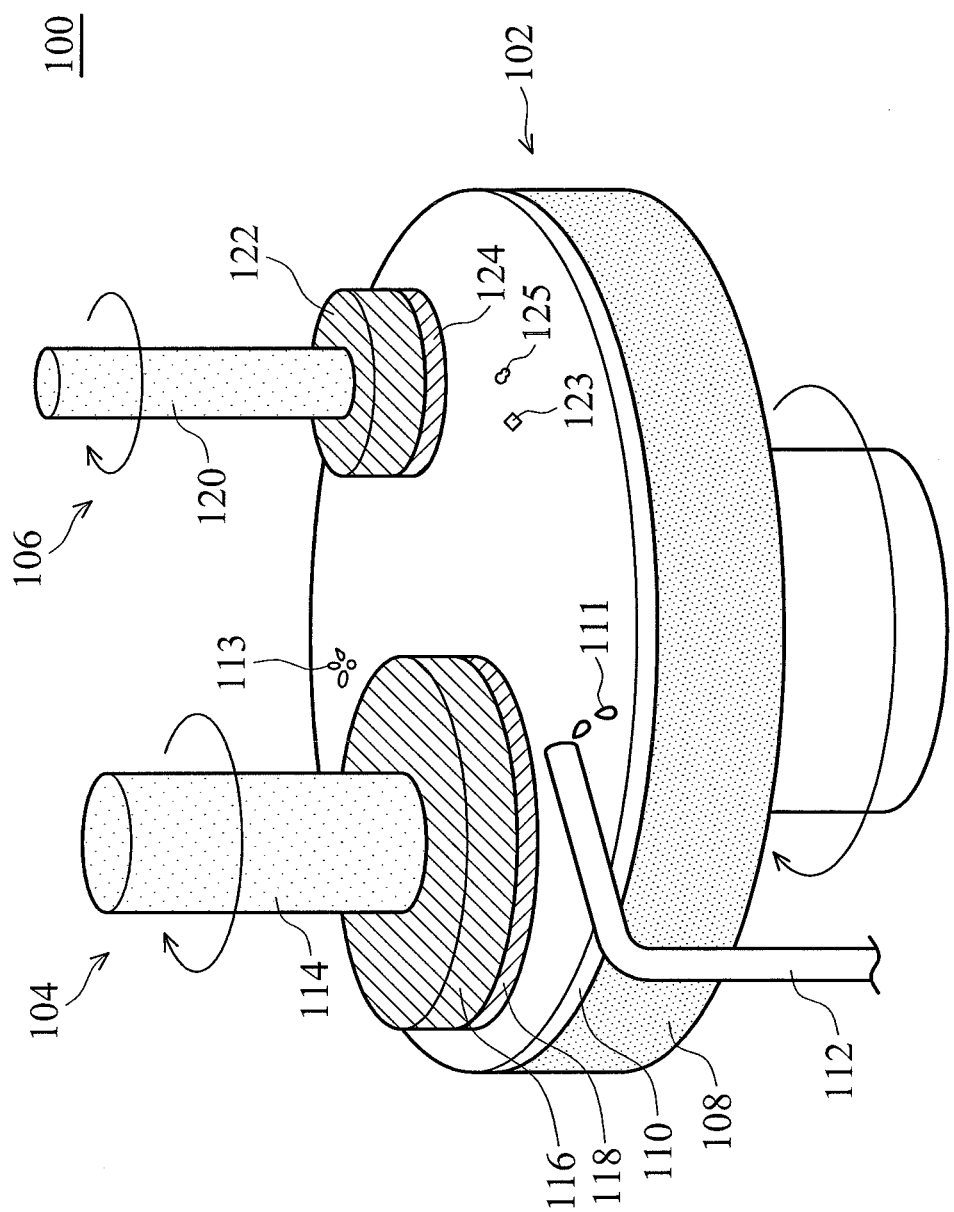
FIG. 1 is a perspective view of a CMP system, in accordance with some embodiments.

FIG. 1 is a perspective view of a CMP system 100, in accordance with some embodiments. CMP system 100 includes a polishing assembly 102, a wafer carrying assembly 104, and a conditioning assembly 106. Wafer carrying assembly 104 is used to hold a wafer 118 against polishing assembly 102 to perform a CMP process. Polishing assembly 102 includes a rotatable platen 108, a polishing pad 110 mounted on rotatable platen 108, and a slurry supply 112. Wafer carrying assembly 104 includes a wafer arm 114 and wafer carrier 116.

Wafer carrier 116 is adapted to hold wafer 118 to engage a surface of wafer 118 with polishing pad 110 and provide downward pressure on wafer 118. When the CMP process is being performed, polishing pad 110 is in direct contact with wafer 118 and spun by rotatable platen 108. Slurry 111 is continuously provided on polishing pad 110 by slurry supply 112 during the CMP process. In some embodiments, wafer 118 is also rotated by wafer carrying assembly 104 during the CMP process. Wafer 118 and polishing pad 102 may be simultaneously rotated in the same direction (i.e., both in a clockwise direction or in a counterclockwise direction). In some embodiments, wafer 118 and polishing pad 102 are simultaneously rotated in different directions (i.e., one in a clockwise direction and another one in a counterclockwise direction). In some other embodiments, wafer 118 is not rotated during the CMP process.

Slurry 111 may include slurry particles of special sizes, and shapes, and be suspended in an aqueous solution. The slurry particles may be roughly as hard as the material layer of wafer 118 that is to be polished. Acids or bases may be added to the aqueous solution, depending on the material to be polished. In addition, other additives may be added to the aqueous solution, such as surfactants or buffer agents. The polishing rate may be affected by various parameters. The parameters may include the downward pressure on wafer 118, rotational speeds of rotatable platen 108 and wafer carrier 116, the chemical composition of slurry 111, the concentration of the slurry particles in slurry 111, the temperature of slurry 111, and the shape, size, and/or distribution of the slurry particles.

Polishing pad 110 is a porous structure, and has a rough polishing surface. When the polishing process is performed, polishing debris 113 (coming from, for example, the removed portion of wafer 118 and the slurry particles) fills the pores of the polishing pad 110. Therefore, the polishing surface becomes smooth, and the surface roughness of the polishing pad 110 is decreased. As a result, the polishing rate is decreased.

In order to maintain the polishing rate, polishing pad 110 needs to be conditioned to maintain the surface roughness. A dressing operation (or a conditioning operation) is performed to polishing pad 110. As shown in FIG. 1, conditioning assembly 106 is used, which includes a dresser arm 120, a dresser head 122, and a conditioning disc 124, in accordance with some embodiments. In some embodiments, slurry supply 112, wafer carrying assembly 104, and conditioning assembly 106 are sequentially arranged along a spinning direction of rotatable platen 108.

Conditioning disc 124 may be a diamond disc with diamonds embedded in a metallic layer secured to a support plate of conditioning disc 124. The metallic layer is, for example, a Ni layer and/or a Cr layer. Conditioning disc 124 is used to scratch and refresh a surface of polishing pad 110, which has accumulated too much of polishing debris 113. A lower portion of polishing pad 110, which is fresh, is thus exposed and continues to be used for polishing. Due to the dressing by conditioning disc 124, the surface of polishing pad 110 is refreshed and the CMP rate is maintained.

In some embodiments, diamond particles 123 and metallic particles 125 coming from conditioning disc 124 are fallen off and inlaid on polishing pad 110. Diamond particles 123 and metallic particles 125 may cause wafer 118 to become scratched, thus reducing the yield of wafer 118.

Figure 2:
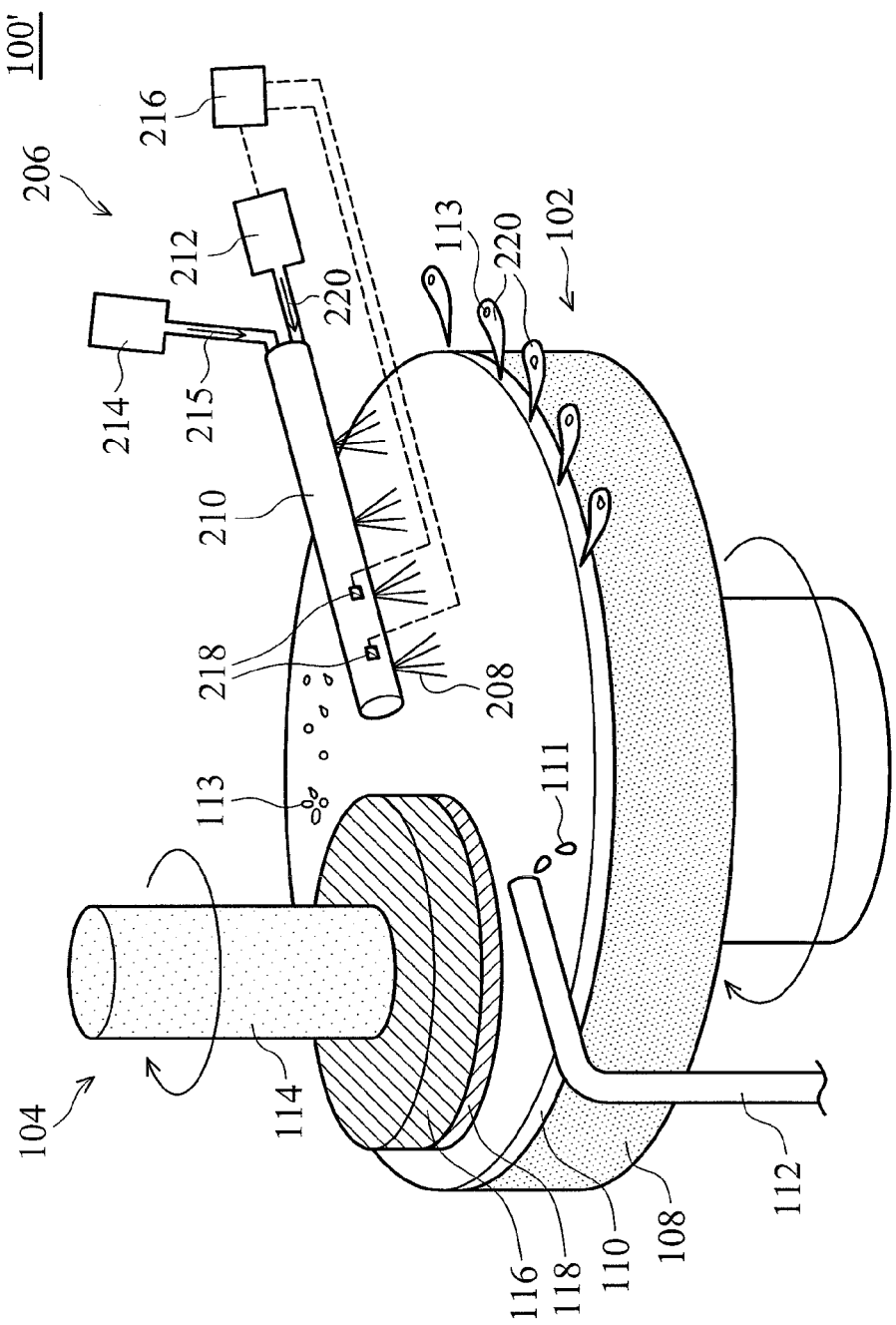
FIG. 2 is a perspective view of a CMP system, in accordance with some embodiments.

In order to condition polishing pad 110 and reduce the scratch problem of wafer 118, a jet assembly 206 as shown in FIG. 2 is used, in accordance with some embodiments. Jet assembly 206 may be used to replace conditioning assembly 106.

FIG. 2 is a perspective view of a CMP system 100', in accordance with some embodiments. CMP system 100' includes polishing assembly 102, wafer carrying assembly 104, and jet assembly 206. Jet assembly 206 is configured to provide a cleaning liquid jet 208 on polishing pad 110. In some embodiments, slurry supply 112, wafer carrying assembly 104, and jet assembly 206 are sequentially arranged along the spinning direction of rotatable platen 108.

Slurry supply 112 provides slurry 111 on polishing pad 110, and then slurry 111 is rotated to be under wafer 118. Wafer 118 is polished by polishing pad 110 with slurry 111. Polishing debris 113 is produced on polishing pad 110 during the polishing process. Then, polishing debris 113 is rotated to be under (or close to) jet assembly 206 and is then washed away by cleaning liquid jet 208 from jet assembly 206. Cleaning liquid 220 from jet assembly 206 may be spun off polishing pad 110 before being mixed with slurry 111 or reaching wafer 118.

In some embodiments, jet assembly 206 includes a jet provider 210 and a cleaning liquid supply 212. Cleaning liquid supply 212 is configured to provide cleaning liquid 220 to jet provider 210. Jet provider 210 has multiple nozzles, each having a nozzle hole, for dispensing cleaning liquid 220. Cleaning liquid 220 is ejected from jet provider 210 to form cleaning liquid jet 208 on polishing pad 110. Cleaning liquid jet 208 impacts polishing pad 110 and remove polishing debris 113 from polishing pad 110. Due to the centrifugal force exerted by the spinning motion of rotatable platen 108, cleaning liquid 220 along with polishing debris 113 is spun off polishing pad 110 before reaching slurry supply 112. As a result, polishing pad 110 is cleaned and conditioned. In some embodiments, the operation time for cleaning polishing pad 110 by cleaning liquid jet 208 is in a range from about 5 seconds to about 50 seconds.

Cleaning liquid jet 208 may include water, such as deionized water. In some embodiments, cleaning liquid jet 208 includes a cleaning solution. The cleaning solution may help to dissolve or remove polishing debris 113 embedded in polishing pad 110. The cleaning solution may contain an acid solution or a basic solution, depending on applications. The acid solution or the basic solution may be used to reduce the surface tension between polishing pad 110 and polishing debris 113. The acid solution may include a citric acid solution or another applicable solution. The basic solution may include an ammonium hydroxide solution or another applicable solution. In some embodiments, cleaning liquid 220 has a pH value which is in a range from about 2 to about 13. In some embodiments, cleaning liquid 220 provided by jet provider 210 contains no slurry particle.

The conditioning of polishing pad 110 is further assisted by using pressure and temperature. In some embodiments, cleaning liquid jet 208 is pressurized to have a pressure in a range from about 100 hPa to about 300 hPa. A flow rate of cleaning liquid jet 208 may be in a range from about 0.2 l/min to about 8 l/min. In some embodiments, jet assembly 206 includes a gas supply 214 which is configured to introduce gas 215 into jet provider 210. Due to the existence of gas 215, cleaning liquid jet 208 is pressurized. Gas 215 may be made of $N_2$, inert gas (such as He, Ne, and/or Ar), air, or combinations thereof. Other type of gases may be used.

Cleaning liquid jet 208, which is pressurized, has a strong force to dislodge debris 113 trapped in polishing pad 110 to refresh the polishing pad surface. As a result, polishing pad 110 is conditioned and capable of holding new slurry particles from newly provided slurry 111.

In some embodiments, cleaning liquid jet 208 is highly pressurized such that an upper portion of polishing pad 110 is slightly removed. A fresh surface of polishing pad 110 is exposed. Compared to conditioning disc 124, which may have different qualities and conditions after being used for a while, cleaning liquid jet 208 may be easily controlled to have a uniform cleaning quality. As a result, the surface profile of polishing pad 110, cleaned or conditioned by cleaning liquid jet 208, is uniform.

In some embodiments, a temperature of cleaning liquid jet 208 is further increased to help dislodge polishing debris 113 trapped in polishing pad 110 to refresh the polishing pad surface. For example, a temperature control assembly 216 is configured to increase and control the temperature of cleaning liquid jet 208. For example, the temperature of the cleaning liquid 220 provided by cleaning liquid supply 212 is controlled by temperature control assembly 216. There may be a heating element (not shown) in cleaning liquid supply 212 or in jet provider 210 to increase the temperature of cleaning liquid jet 208. The heating element is controlled by temperature control assembly 216.

Studies show that removal efficiency of polishing debris 113 increases with the increase in the temperature of cleaning liquid jet 208. In some embodiments, the temperature of cleaning liquid jet 208 is in a range from about 30° C. to about 99° C. Because cleaning liquid jet 208 with a higher temperature removes polishing debris 113 at a higher rate, polishing performance is further improved.

In some embodiments, jet assembly 206 includes a temperature sensor 218. Temperature sensor 218 may be set near the nozzle holes of jet provider 210. The temperature of cleaning liquid jet 208 is thus detected by temperature sensor 218. Temperature sensor 218 is electrically connected to temperature control assembly 216. According to the information received from temperature sensor 218, temperature control assembly 216 adjusts the temperature of the cleaning liquid 220 provided into jet provider 210. Therefore, the temperature of cleaning liquid jet 208 is maintained at the desired level. The polishing performance is therefore well controlled. In some other embodiments, temperature sensor 218 may be set near polishing pad 110, such that a desired temperature of polishing pad 110 is maintained. As a result, the uniformity of the polishing performance is improved.

As shown in FIG. 2, polishing debris 113, which is formed after the polishing of wafer 118, is washed away by cleaning liquid jet 208. Slurry 111, which is used, is also removed by cleaning liquid jet 208. As a result, wafer 118 is polished by using cleaned polishing pad 110 and fresh slurry 111, which is newly provided. Polishing performance is therefore improved.

Because conditioning assembly 106 is replaced by jet assembly 206. Diamond particles 123 and metallic particles 125 (such as those shown in FIG. 1) do not exist on polishing pad 110. As a result, the risk of wafer 118 being scratched by abrasive particles from conditioning assembly 106 is greatly reduced.

Figure 3:
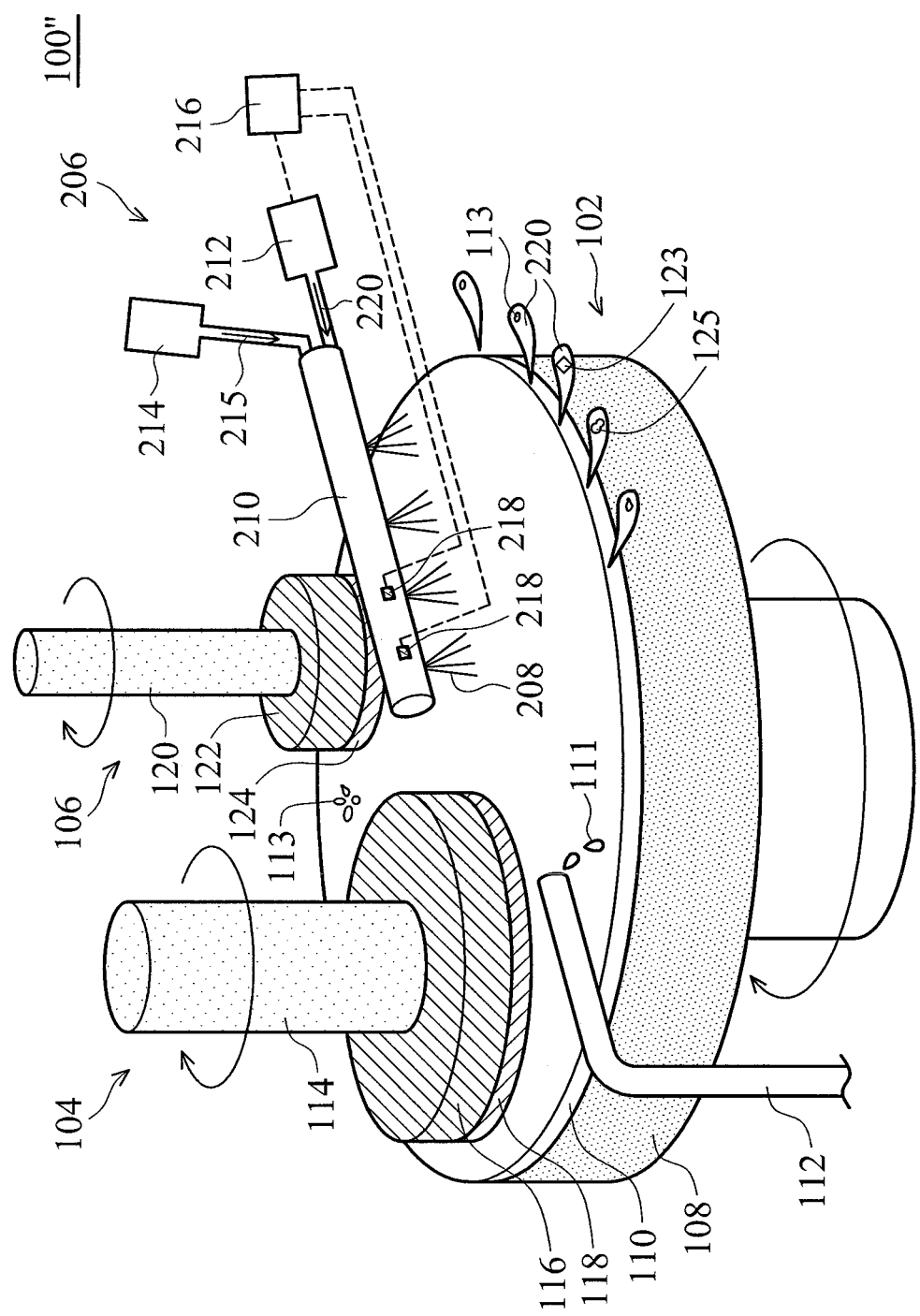
FIG. 3 is a perspective view of a CMP system, in accordance with some embodiments.

Alternatively, conditioning assembly 106 and jet assembly 206 can coexist. FIG. 3 is a perspective view of a CMP system 100", in accordance with some embodiments. Both conditioning assembly 106 and jet assembly 206 are used to restore polishing pad 110. In some embodiments, slurry supply 112, wafer carrying assembly 104, conditioning assembly 106, and jet assembly 206 are sequentially arranged along the spinning direction of rotatable platen 108.

Slurry supply 112 provides slurry 111 on polishing pad 110, and then slurry 111 is rotated to be under wafer 118. Wafer 118 is polished by polishing pad 110 with slurry 111. Polishing debris 113 is produced on polishing pad 110 during the polishing process. Afterwards, polishing debris 113 is rotated to be under conditioning disk 124. Remained polishing debris 113 and particles is then rotated to be under (or close to) jet assembly 206 and is washed away by cleaning liquid jet 208.

There may be diamond particles 123 and metallic particles 125 fallen on polishing pad 110. Diamond particles 123 and metallic particles 125 may also be washed away by cleaning liquid jet 208. Cleaning liquid 220 along with remained polishing debris 113, diamond particles 123 and metallic particles 125 may be spun off polishing pad 110 before being mixed with slurry 111 or reaching wafer 118.

In some embodiments, the cleaning of jet assembly 206 and the dressing of conditioning assembly 106 may be performed simultaneously. Alternatively, the cleaning of jet assembly 206 and the dressing of conditioning assembly 106 may be performed in different time. Even if diamond particles 123 and metallic particles 125 (such as those shown in FIG. 1) coming from conditioning disc 124 are left on polishing pad 110, cleaning liquid jet 208 provided by jet assembly 206 is capable of washing away diamond particles 123 and metallic particles 125. Wafer 118 is prevented from being scratched or contaminated during the CMP process.

Embodiments of the disclosure provide methods for performing a CMP process by using CMP system 100' or CMP system 100". The methods have many variations. Afterwards, some variations are described in more detail.

Figure 4A:
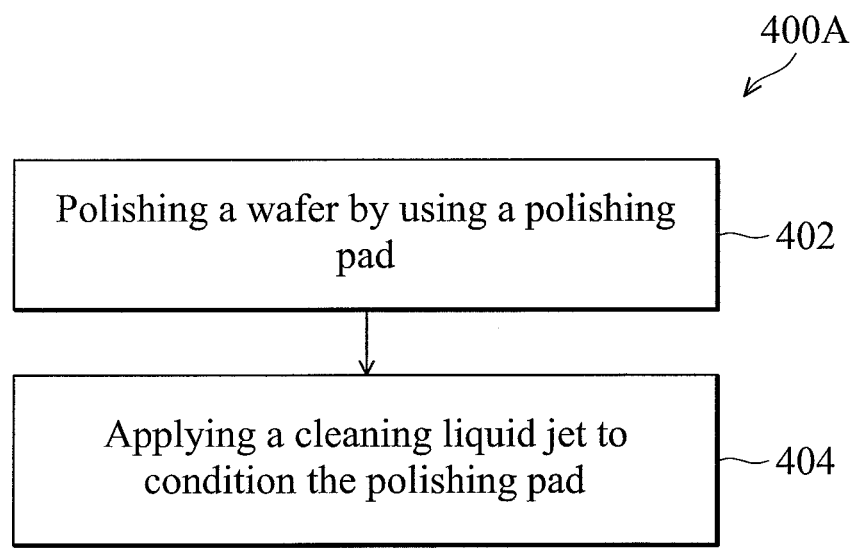
FIGS. 4A-4C are flow charts each illustrating a method for performing a CMP process, in accordance with some embodiments.

FIG. 4A is a flow chart illustrating a method 400A for performing a CMP process, in accordance with some embodiments. Referring to FIGS. 2 and 4A, method 400A begins with an operation 402 in which one (or more) wafer (such as wafer 118) is polished by using polishing pad 110. Method 400A continues with an operation 404 in which cleaning liquid jet 208 is applied on polishing pad 110 to condition polishing pad 110. In some embodiments, liquid jet 208 is applied on polishing pad 110 during the polishing of the wafer (such as wafer 118). Alternatively, cleaning liquid jet 208 is applied on polishing pad 110 after the polishing of the wafer (such as wafer 118).

In some embodiments, after multiple wafers are polished by polishing pad 110, cleaning liquid jet 208 is applied on polishing pad 110 to condition and clean polishing pad 110. In some embodiments, polishing pad 110 is cleaned and conditioned by cleaning liquid jet 208 every time after the polishing of each wafer is completed.

In some embodiments, polishing pad 110 is washed by cleaning liquid jet 208 during the polishing of wafer 118. The operation time for cleaning polishing pad 110 by cleaning liquid jet 208 is less than the polishing of wafer 118. For example, the operation time for cleaning polishing pad 110 by cleaning liquid jet 208 is about ⅓ to about ⅛ of the operation time for polishing wafer 118. For example, the operation time for polishing wafer 118 is about 120 seconds.

Polishing pad 110 may be cleaned by cleaning liquid jet 208 when wafer 118 begins to be polished. For example, polishing pad 110 is cleaned by cleaning liquid jet 208 during the first 30 seconds of the polishing of wafer 118. Alternatively, polishing pad 110 may be cleaned by cleaning liquid jet 208 during the end of the polishing of wafer 118. For example, polishing pad 110 is cleaned by cleaning liquid jet 208 during the last 30 seconds of the polishing of wafer 118. In some other embodiments, polishing pad 110 is cleaned by cleaning liquid jet 208 during the middle of the process for polishing wafer 118. In some other embodiments, polishing pad 110 is cleaned by cleaning liquid jet 208 more than once during the process for polishing wafer 118.

Figure 4B:
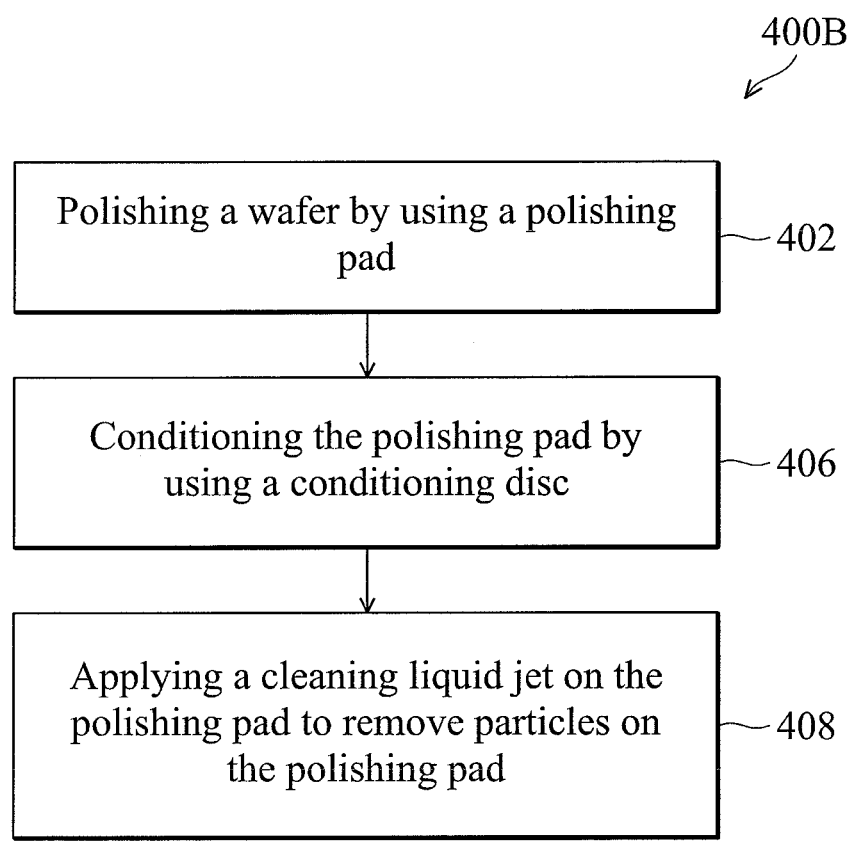

Embodiments of the disclosure are not limited to the embodiments mentioned above. FIG. 4B is a flow chart illustrating a method 400B for performing a CMP process, in accordance with some embodiments.

Referring to FIGS. 3 and 4B, method 400B begins with an operation 402 in which one (or more) wafer (such as wafer 118) is polished by using polishing pad 110. Afterwards, method 400B continues with an operation 406 in which polishing pad 110 is conditioned by using conditioning disc 124. In some embodiments, polishing pad 110 is conditioned during the polishing of the wafer (such as wafer 118). Alternatively, polishing pad 110 may be conditioned after the polishing of the wafer (such as wafer 118).

Method 400B then continues with an operation 408 in which cleaning liquid jet 208 is applied on polishing pad 110 to remove particles (such as debris 113, diamond particles 123 and metallic particles 125) on polishing pad 110. In some embodiments, cleaning liquid jet 208 is applied on polishing pad 110 during the conditioning of polishing pad 110 by conditioning disc 124. Alternatively, cleaning liquid jet 208 may be applied on polishing pad 110 after the conditioning of polishing pad 110. Both conditioning disc 124 and cleaning liquid jet 208 are used to condition polishing pad 110. The dressing of conditioning disc 124 and the cleaning of cleaning liquid jet 208 may be simultaneously performed. Alternatively, the dressing of conditioning disc 124 and the cleaning of cleaning liquid jet 208 may be sequentially performed.

Figure 4C:
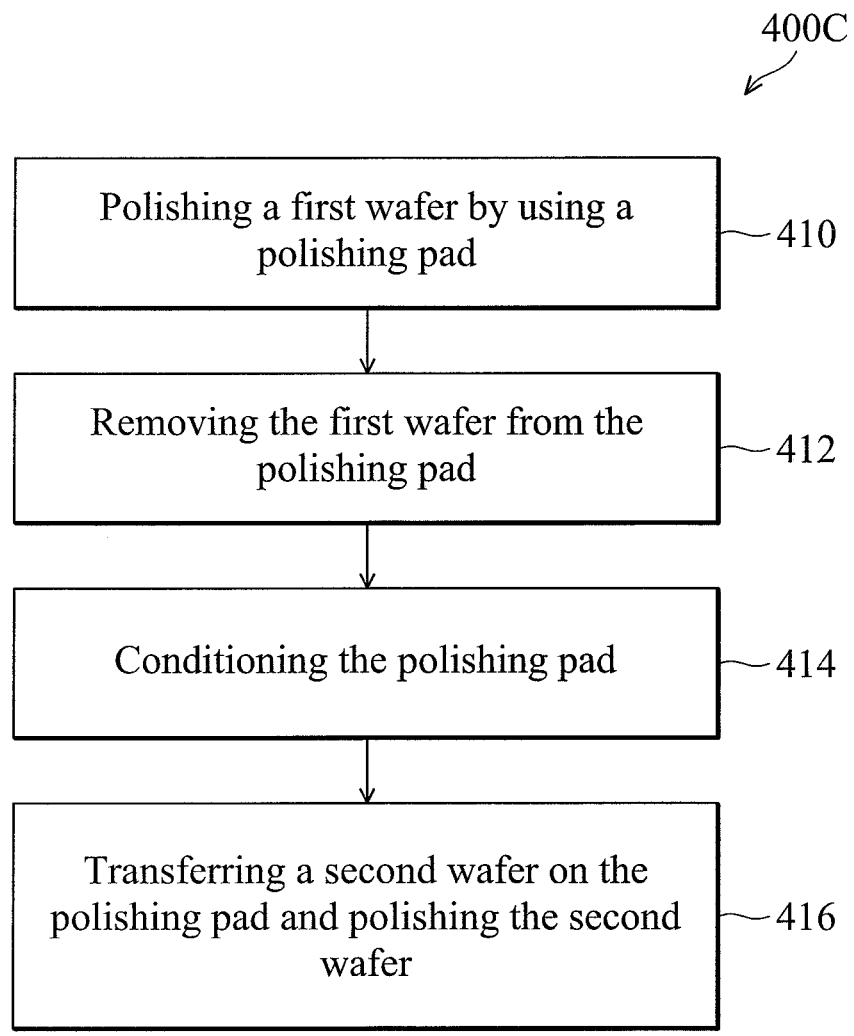
Figure 5:
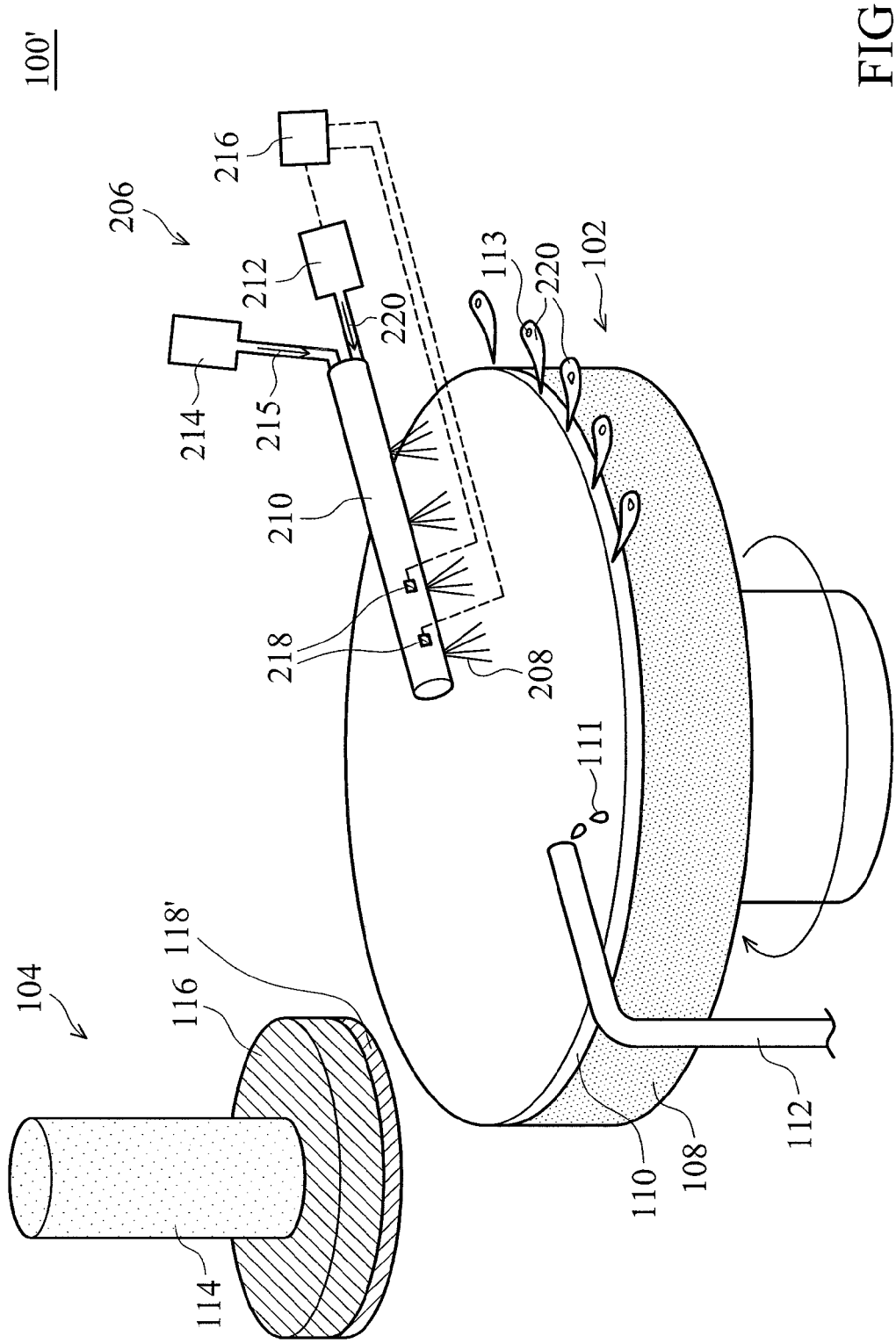
FIG. 5 is a perspective view of a CMP system, in accordance with some embodiments.

Embodiments of the disclosure are not limited to the embodiments mentioned above. FIG. 4C is a flow chart illustrating a method 400C for performing a CMP process, in accordance with some embodiments. FIG. 5 is a perspective view of CMP system 100', in accordance with some embodiments.

Referring to FIGS. 2, 5, and 4C, method 400C begins with an operation 410 in which a first wafer (such as wafer 118 shown in FIG. 2) is polished by using polishing pad 110. Method 400C continues with an operation 412 in which the first wafer (such as wafer 118) is removed from polishing pad 110.

Afterwards, method 400C continues with operation 414 in which polishing pad 110 is conditioned. For example, polishing pad 110 is conditioned by applying a cleaning liquid jet on polishing pad 110. In some other embodiments, cleaning liquid jet 208 is applied on polishing pad 110 during the polishing of wafer 118. Afterwards, a second cleaning liquid jet provided by jet provider 210 is used to condition and clean polishing pad 110.

Method 400C continues with operation 416 in which a second wafer 118' is transferred to be on polishing pad 110 to polish second wafer 118'. Second wafer 118' is transferred to be on polishing pad 110 for polishing after cleaning liquid jet 208 has been applied on polishing pad 110. Alternatively, second wafer 118' may be polished during cleaning liquid jet 208 is applied on polishing pad 110. Cleaning liquid jet 208 washes polishing pad 110 during wafers 118 and 118' are unloaded and loaded. Fabrication time is thus reduced.

Figure 6:
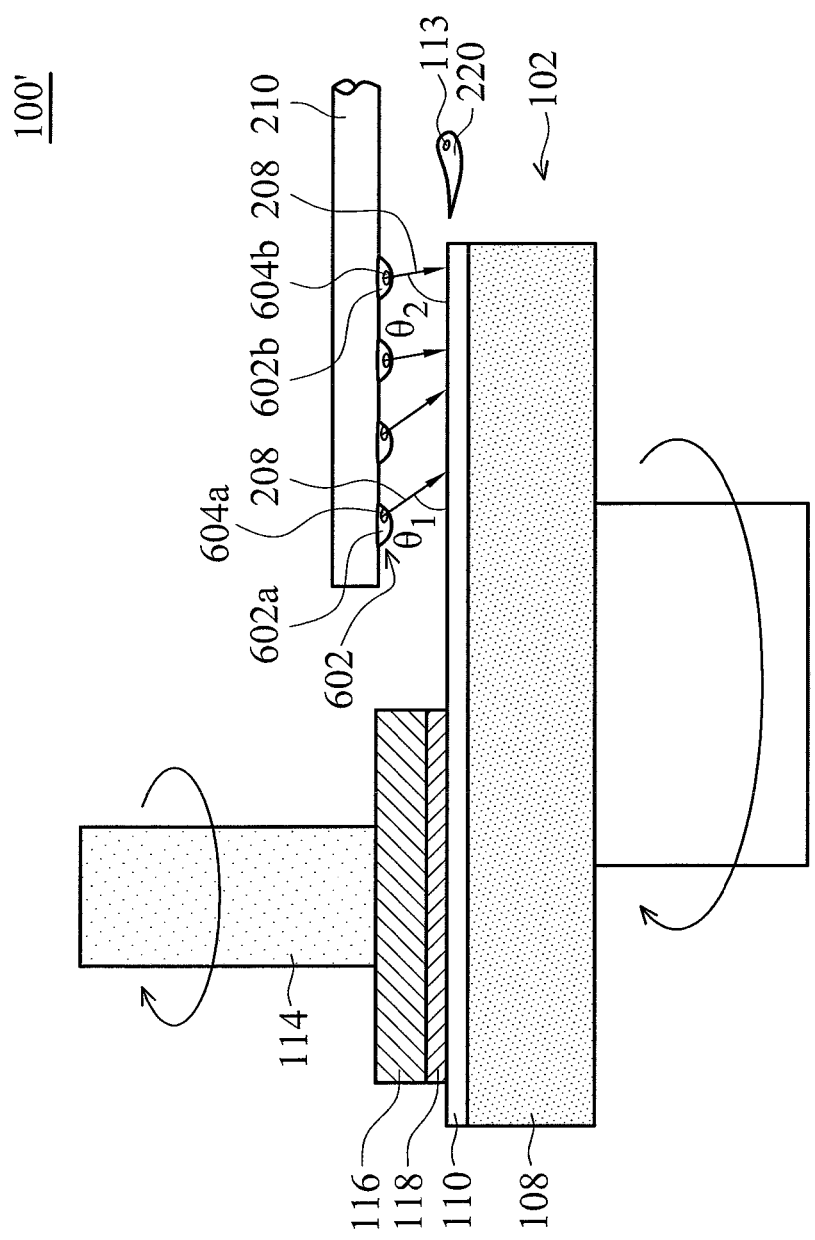
FIG. 6 is a side view of a CMP system, in accordance with some embodiments.

Embodiments of the disclosure may have many variations. FIG. 6 is a side view of CMP system 100', in accordance with some embodiments. In some embodiments, jet provider 210 has multiple nozzles 602 including nozzles 602a and 602b. Nozzles 602a and 602b are positioned over an inner portion of polishing pad 110 and an outer portion of polishing pad 110, respectively. Nozzles 602a and 602b may be rotatable and have nozzle holes 604a and 604b, respectively. Nozzles 602a and 602b may be rotated such that nozzle holes 604a and 604b are aligned with desired directions. Therefore, main directions of cleaning liquid jets 208 ejected from nozzle holes 604a and 604b are controlled.

In some embodiments, an acute angle $\theta_1$ is between the main direction of cleaning liquid jet 208 ejected from nozzle 602a and the upper surface of polishing pad 110. An acute angle $\theta_2$ is between the main direction of cleaning liquid jet 208 ejected from nozzle 602b and the upper surface of polishing pad 110. Acute angle $\theta_1$ is smaller than acute angle $\theta_2$. As a result, polishing debris 113 over the central portion of polishing pad 110 can be washed to the edge of polishing pad 110 and be spun off polishing pad 110 before reaching wafer 118.

Embodiments of mechanisms for conditioning and/or removing particles from a polishing pad are provided. A cleaning liquid jet is used to condition and clean the polishing pad. Pressure and temperature may be used as process parameters to enhance the conditioning and the cleaning of the polishing pad. The cleaning liquid jet may be used independently or in conjunction with a conditioning disk. By using the cleaning liquid jet, the risk of wafer scratching is greatly reduced. Polishing performance and yield is therefore significantly increased.

In accordance with some embodiments, a method for performing a CMP process is provided. The method includes polishing a wafer by using a polishing pad. The method also includes applying a cleaning liquid jet on the polishing pad to condition the polishing pad.

In accordance with some embodiments, a method for performing a CMP process is provided. The method includes polishing a wafer by using a polishing pad. The method also includes conditioning the polishing pad by using a conditioning disk. The method further includes applying a cleaning liquid jet on the polishing pad to remove particles on the polishing pad.

In accordance with some embodiments, a CMP system is provided. The CMP system includes a polishing assembly having a rotatable platen and a polishing pad. The CMP system also includes a wafer carrying assembly configured to engage a wafer to the polishing pad. The CMP system further includes a jet assembly configured to apply a cleaning liquid jet on the polishing pad.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method for performing a chemical mechanical polishing (CMP) process, comprising:
    polishing a wafer by using a polishing pad;
    applying a cleaning liquid jet on the polishing pad to condition the polishing pad during the polishing of the wafer; and
    applying a second cleaning liquid jet on the polishing pad, wherein a first acute angle between a main direction of the cleaning liquid jet and a surface of the polishing pad is different from a second acute angle between a main direction of the second cleaning liquid jet and the surface of the polishing pad, and the cleaning liquid jet is closer to a center of the polishing pad than the second cleaning liquid jet, and the first acute angle is smaller than the second acute angle.

2. The method for performing a CMP process as claimed in claim 1, further comprising increasing a temperature of the cleaning liquid jet, wherein the temperature of the cleaning liquid jet is increased to be in a range from about 30° C. to about 99° C.

3. The method for performing a CMP process as claimed in claim 2, further comprising controlling the temperature of the cleaning liquid jet by a temperature control assembly.

4. The method for performing a CMP process as claimed in claim 1, wherein the cleaning liquid jet is pressurized to have a pressure in a range from about 100 hPa to about 300 hPa.

5. The method for performing a CMP process as claimed in claim 1, wherein the cleaning liquid jet is applied on the polishing pad by using a jet provider.

6. The method for performing a CMP process as claimed in claim 5, further comprising introducing a gas into the jet provider to pressurize the cleaning liquid jet.

7. The method for performing a CMP process as claimed in claim 6, wherein the gas is made of $N_2$, He, Ne, Ar, air, or combinations thereof.

8. The method for performing a CMP process as claimed in claim 1, further comprising applying a third cleaning liquid jet on the polishing pad after the wafer is polished by using the polishing pad.

9. The method for performing a CMP process as claimed in claim 1, further comprising:
removing the wafer from the polishing pad;
applying a third cleaning liquid jet on the polishing pad; and
transferring a second wafer on the polishing pad and polishing the second wafer after the third cleaning liquid jet is applied on the polishing pad.

10. The method for performing a CMP process as claimed in claim 1, wherein the cleaning liquid jet is made of water.

11. The method for performing a CMP process as claimed in claim 1, wherein the cleaning liquid jet contains no slurry particle.

12. The method for performing a CMP process as claimed in claim 1, further comprising rotating the polishing pad during the application of the cleaning liquid jet on the polishing pad.

13. The method for performing a CMP process as claimed in claim 1, further comprising conditioning the polishing pad by using a conditioning disk, wherein the cleaning liquid jet is applied on the polishing pad during the conditioning of the polishing pad by the conditioning disc.

14. The method for performing a CMP process as claimed in claim 13, further comprising providing slurry on the polishing pad during the polishing of the wafer, wherein the slurry is provided using a slurry supply, the cleaning liquid jet is applied using a jet assembly, and the slurry supply, the wafer, the conditioning disk, and the jet assembly are sequentially arranged along a spinning direction of the polishing pad.

15. The method for performing a CMP process as claimed in claim 1, wherein the cleaning jet and the second cleaning jet is provided by a jet provider.

16. The method for performing a CMP process as claimed in claim 1, wherein the cleaning jet and the second cleaning jet contains no slurry particle.

17. The method for performing a CMP process as claimed in claim 1, wherein the second cleaning jet is applied on the polishing pad during the polishing of the wafer.

18. A method for performing a chemical mechanical polishing (CMP) process, comprising:
polishing a wafer by using a polishing pad;
providing slurry on the polishing pad during the polishing of the wafer;
applying a cleaning liquid jet on the polishing pad to condition the polishing pad during the polishing of the wafer; and
applying a second cleaning liquid jet on the polishing pad, wherein a first acute angle between a main direction of the cleaning liquid jet and a surface of the polishing pad is different from a second acute angle between a main direction of the second cleaning liquid jet and the surface of the polishing pad, and the cleaning liquid jet is closer to a center of the polishing pad than the second cleaning liquid jet, and the first acute angle is smaller than the second acute angle.

19. The method for performing a CMP process as claimed in claim 18, further comprising increasing a temperature of the cleaning liquid jet during the application of the cleaning liquid on the polishing pad.

20. A method for performing a chemical mechanical polishing (CMP) process, comprising:
polishing a wafer by using a polishing pad;
applying a cleaning liquid jet on the polishing pad by using a jet provider to condition the polishing pad during the polishing of the wafer, wherein the cleaning liquid jet contains no slurry particle, and a gas is introduced into the jet provider to pressurize the cleaning liquid jet; and
applying a second cleaning liquid jet on the polishing pad, wherein a first acute angle between a main direction of the cleaning liquid jet and a surface of the polishing pad is different from a second acute angle between a main direction of the second cleaning liquid jet and the surface of the polishing pad, and the cleaning liquid jet is closer to a center of the polishing pad than the second cleaning liquid jet, and the first acute angle is smaller than the second acute angle.

\* \* \* \* \*